United States Patent [19]
Camerson

[11] Patent Number: 5,738,751
[45] Date of Patent: Apr. 14, 1998

[54] SUBSTRATE SUPPORT HAVING IMPROVED HEAT TRANSFER

[75] Inventor: John Field Camerson, Los Altos, Calif.

[73] Assignee: Applied Materials, Inc., Santa Clara, Calif.

[21] Appl. No.: 299,716

[22] Filed: Sep. 1, 1994

[51] Int. Cl.$^6$ ...................................... B25B 11/00
[52] U.S. Cl. .................... 156/345; 118/724; 118/728; 279/128; 361/234; 165/80.1
[58] Field of Search .............. 156/345; 279/128; 361/234; 118/728, 724, 725; 204/298.15; 165/80.1

[56] References Cited

U.S. PATENT DOCUMENTS

| | | | |
|---|---|---|---|
| 4,512,391 | 4/1985 | Harra | 118/725 X |
| 4,949,783 | 8/1990 | Lakios et al. | 165/80.1 |
| 5,155,652 | 10/1992 | Logan et al. | 361/234 |
| 5,213,349 | 5/1993 | Elliott | 279/128 |
| 5,215,619 | 6/1993 | Cheng et al. | 156/345 |
| 5,221,403 | 6/1993 | Nozawa et al. | 156/345 |
| 5,238,499 | 8/1993 | van de Ven et al. | 118/724 |
| 5,290,381 | 3/1994 | Nozawa et al. | 156/345 |
| 5,354,382 | 10/1994 | Sung et al. | 118/725 X |
| 5,376,213 | 12/1994 | Ueda et al. | 156/345 |
| 5,382,311 | 1/1995 | Ishikawa et al. | 156/345 |

FOREIGN PATENT DOCUMENTS

| | | |
|---|---|---|
| 0272142 | 6/1988 | European Pat. Off. . |
| 0566220 | 10/1993 | European Pat. Off. . |
| 6-216077 | 5/1994 | Japan . |

*Primary Examiner*—Thi Dang
*Attorney, Agent, or Firm*—Ashok K. Janah; Peter J. Sgarbossa; Robert W. Mulcahy

[57] ABSTRACT

A substrate support member includes a pedestal and conductive member. The conductive member is cooled by the passage of a coolant therethrough, and a heat transfer enhancing fluid is flowed into the interface between the pedestal and the conductive member to increase the heat transfer from the pedestal to the conductive member.

11 Claims, 3 Drawing Sheets

SUBSTRATE SUPPORT HAVING IMPROVED HEAT TRANSFER

BACKGROUND OF THE INVENTION

The present invention relates to the field of semiconductor processing equipment. More particularly, the present invention provides apparatuses and methods for improved heat transfer between a wafer and a heat sink in a semiconductor processing chamber.

The fabrication of integrated circuits on substrates, such as semiconductor wafers, typically requires the sequential deposition of thin film layers on the wafers with intermediate pattern etching steps. Typically, the etching is accomplished by forming a patterned resist layer over a film layer and then exposing the resist layer to an etchant. The etchant etches the areas of the underlying film layer which are exposed to the etchant by the patterned resist to form circuit architecture. In one etch process, a plasma is excited from one or more gas species introduced into the chamber. The formation of the plasma creates ions of the gas species which are highly reactive with the material of the exposed film layer. One type of plasma etch chamber typically includes a sealable grounded enclosure within which a wafer support member, commonly referred to as a "pedestal" is located. The pedestal is received over a second support member, commonly referred to as a "cathode", which is connected to a capacitively coupled r.f. power supply. The wafer is placed on the pedestal, and a gas is charged into the enclosure. The enclosure is typically maintained at a pressure in the millitorr range, and the gas disassociates when it enters the low pressure region inside of the chamber. The r.f. voltage is applied to the cathode to create a circuit path from the cathode, through the pedestal, the gas and the grounded enclosure wall. This r.f. voltage excites the gas into a plasma to provide the desired etch environment within the chamber. As a secondary effect, the plasma generates substantial heat within the chamber which is transferred to the various chamber components and the wafer. If this heat is not removed from the wafer, the wafer temperature will quickly exceed the thermal breakdown temperature of the etch pattern defining resist layer on the wafer. If the temperature of the wafer exceeds this breakdown temperature, the resist layer will degrade and allow indiscriminate etching of the underlying film layer.

Because the wafer is processed in a vacuum environment, and the gap between the pedestal and the cathode is maintained at vacuum conditions, there is minimal conductive or convective heat transfer between the wafer and pedestal or between the pedestal and the cathode. This heat transfer limitation has two effects: The maximum energy density of the plasma, and thus the maximum etch rate of the film layer, is limited by the heat transfer capability of the wafer to pedestal and pedestal to cathode interface, and, if the plasma energy density exceeds this heat transfer capability of the system, the wafer temperature will rapidly exceed the thermal breakdown temperature of the resist layer and the circuitry being formed on the wafer may be destroyed.

One method of enhancing the heat transfer from the wafer, and thereby enabling the use of a higher energy density plasma, flows a gas between the wafer and the pedestal to provide a conductive and/or convective path for heat transfer between the wafer and the pedestal. This cooling method is commonly referred to as backside cooling. Additionally, the cathode on which the pedestal is mounted is cooled, typically by flowing chilled water through channels provided in the cathode. The combination of the heat transfer from the wafer enabled by the backside cooling gas, and the cooling of the cathode by flowing a coolant therethrough, will cool the wafer sufficiently to allow the maintenance of a higher plasma energy density than that possible with a non-cooled configuration. However, despite the use of the gas and the cooling of the cathode, transfer of heat from the wafer into the cooling water is still limited, primarily by a poor thermal connection at the interface of the cathode and the pedestal.

The cathode and pedestal are typically connected by a plurality of bolts extending about the perimeter of the two elements. These bolts provide some intimate contact between the pedestal and the cathode in the annular region defined by the bolts circle at which these two chamber elements are connected, but they do nothing to ensure intimate contact elsewhere at the pedestal-cathode interface. The heat transfer elsewhere at the interface is limited by three factors: The interface region is maintained at a vacuum so no conductive or convective heat transfer can occur across any gap between the cathode and pedestal; the cathode and pedestal are not perfectly flat and areas of non-contact between the cathode and the pedestal abound in the interface; and the areas where the cathode and pedestal do contact are not perfectly smooth, so contact, and thus heat conduction, occurs only where the peaks of the cathode surface contact the peaks of the pedestal surface. Therefore, a high heat transfer region is created adjacent the edge of the cathode and pedestal, but a low heat transfer region remains over the remainder of the cathode-pedestal interface. This non-uniform heat transfer through the pedestal-cathode interface translates into a non-uniform temperature on the wafer surface. In the areas of the wafer which are directly above the bolt circle, the wafer temperature is lowest and in the regions of the wafer spaced radially inwardly or outwardly from the bolt circle the wafer temperature is highest. The maximum energy density of the plasma, and thus the etch rate of the wafer, is limited by the heat transfer from the wafer at the highest temperature region of the wafer, which is typically adjacent the center of the wafer.

To enhance the heat transfer from the pedestal and into the cathode in the central interface region, a crinkled or ridged metal foil or a heat conductive film may be placed between the pedestal and cathode. These materials generally increase the heat transfer rate through the central region of the cathode-pedestal interface, but they must be replaced periodically. Replacement of the film or foil is difficult and time consuming, because it often becomes adhered to the cathode or pedestal and must be scraped off. This scraping may damage the cathode or pedestal, and the particles scraped from the cathode may fall into the chamber and later contaminate a wafer. Additionally, the film or foil interlayer material only increases the heat transfer rate between the cathode and the pedestal in regions where both the cathode and the pedestal contact the film or foil. To increase the likelihood of contact with the foil, it may be folded to create ridges. These ridges ensure contact between the cathode, foil and pedestal at the ridges, but also assure non-contact between these elements in areas where the material is not ridged.

Despite the placement of materials such as the film or foil in the pedestal-cathode interface to increase the heat transfer from the pedestal to the cathode, and thereby increase the heat transfer from the wafer into the cooling water, the pedestal will typically remain substantially hotter than the cathode during etch operations which signifies that the pedestal to cathode thermal connection significantly resists heat transfer. Because of the inability to effectively cool the pedestal, the power density of the etch plasma is limited to a level that will not excessively heat the wafer and damage the resist layer thereon. Further, the power density is limited by the highest temperature point on the wafer. Therefore, there exists a need to enable increased heat transfer from the pedestal to the cathode, without the heat transfer and particle generation limitations of the aforementioned foils or films and with greater uniformity of heat transfer rate to enable a more uniform wafer temperature.

SUMMARY OF THE INVENTION

The present invention provides enhanced heat transfer between the pedestal and the cathode by providing a gas between the pedestal and the cathode to provide a heat transfer path between these two elements. The gas may be confined to multiple pockets in the interface between the cathode and the pedestal, confined in a single cavity in the interface between the cathode and the pedestal, or continuously flowed through the interface between the cathode and the pedestal. Additionally, the gas may be supplied to the interface region from the area between the wafer and the pedestal, such as by tapping into the backside gas supply at the wafer receiving surface of the pedestal, or may be introduced directly through the cathode or by other routings and then into the interface between the cathode and the pedestal.

These and other features of the invention will become apparent from the following description, when read in conjunction with the following drawings, wherein:

DESCRIPTION OF THE PREFERRED EMBODIMENTS

Figure 1:
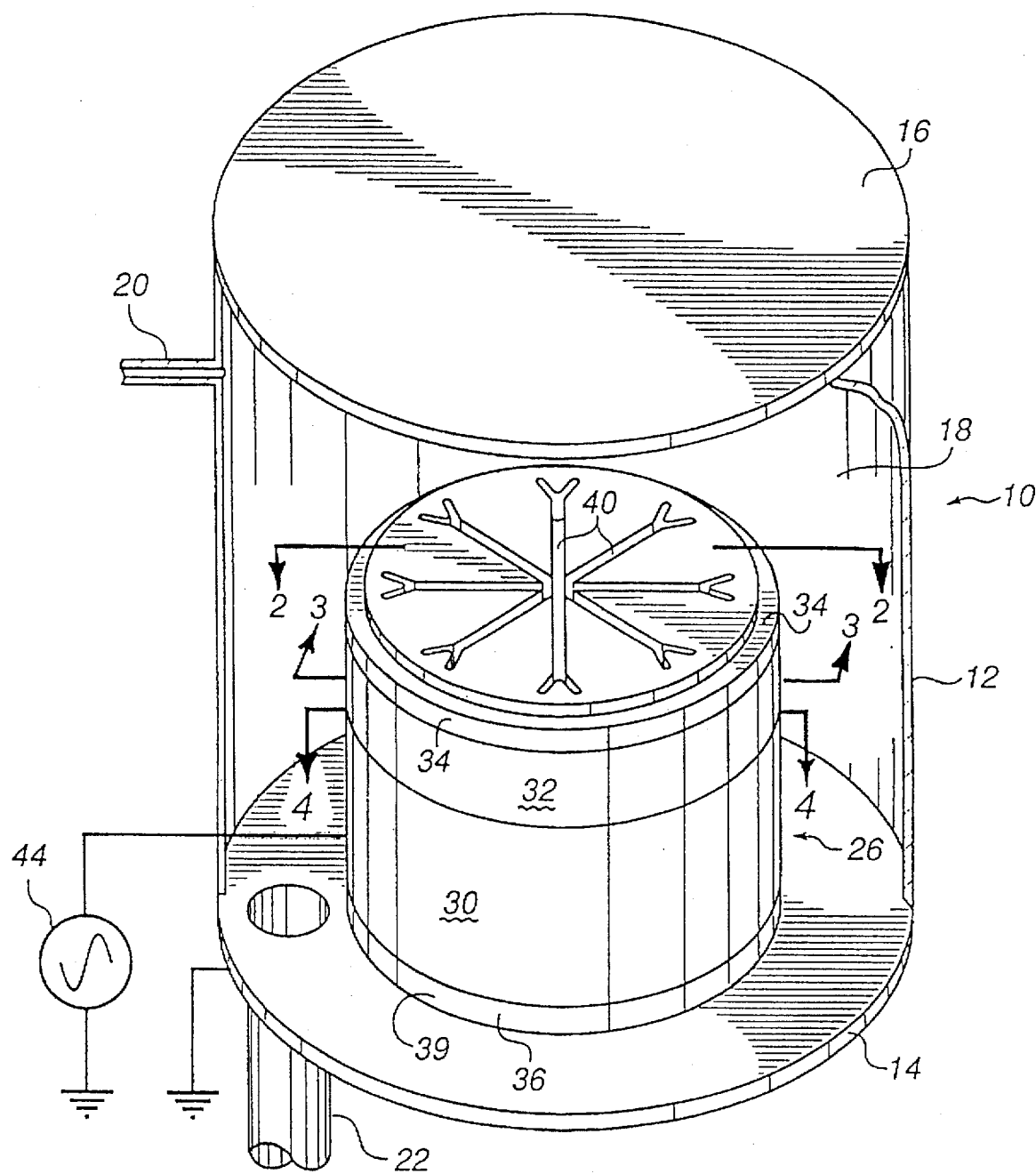
FIG. 1 is a partial sectional view of a plasma processing chamber.

An etch chamber 10 in which the present invention is useful is shown in partial cutaway in FIG. 1. The chamber 10 generally includes a conventional outer enclosure wall 12, a base 14 on which the enclosure wall 12 is supported, and a cover 16 received over the upper end of the enclosure wall 12. The enclosure wall 12, base 14 and cover 16 form a vacuum enclosure 18 in which a process environment such as an etch plasma may be maintained. At least one gas inlet 20 is ported to the vacuum enclosure 18, and an outlet 22 is ported from the enclosure 18, through the chamber base 14, to a vacuum pump (not shown).

A substrate support member 26 is mounted to the base 14 of the chamber 10 to support a wafer 38 thereon when the wafer 38 is processed in the chamber 10. The support member 26 includes a lower conductive member 30, over which is received a pedestal 32 having an electrostatic chuck 34 received on the upper surface thereof. The lower conductive member 30 is preferable received over an electrically insulative member 36 on the base 14, so as to electrically isolate the conductive portion 30 from the base 14. The insulative member 36 may be a separate electrically insulative member as shown in FIG. 1, or the chamber base 14 may be an electrical insulator. The conductive member preferably includes a central, cylindrical recess 31, at the base of which is a sealing insulator plate 33.

Figure 2:
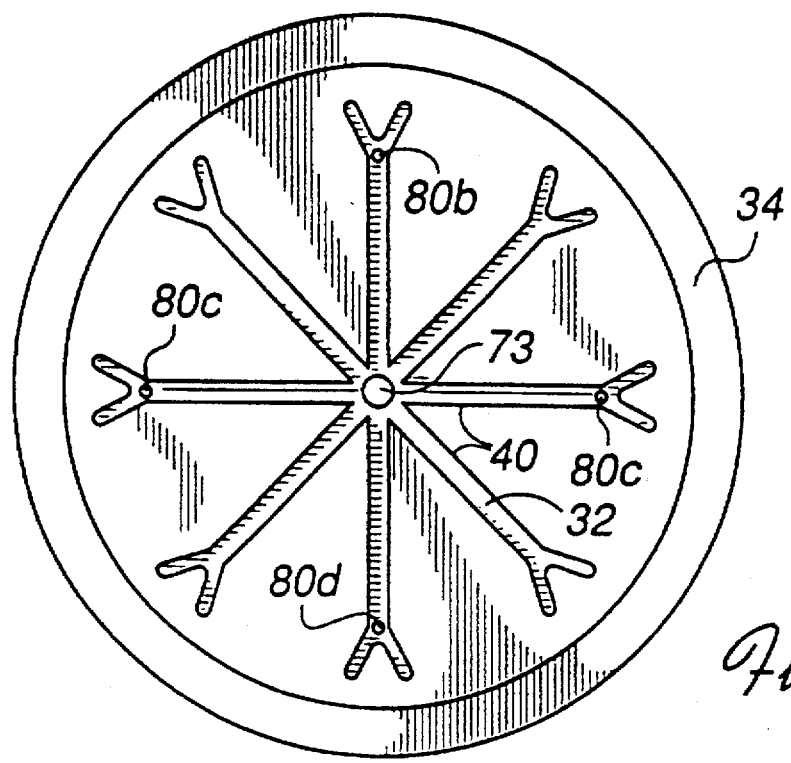
FIG. 2 is a top view of the wafer support member of the processing chamber of FIG. 1 at 2—2.

Referring now to FIGS. 1 and 2, the electrostatic chuck 34 is preferably a thin multi-element sandwich of outer insulative material sheets which encapsulate a thin, planar electrode. Additionally, the electrostatic chuck 34 includes a plurality of grooves 40 therein, at the base of which the underlying upper surface of the pedestal 32 is exposed as shown in FIG. 1. When a wafer 38 is received on the electrostatic chuck 34 as shown in FIG. 3, the grooves 40, in conjunction with the exposed surfaces of the pedestal 32 and the portions of the underside of the wafer 38 received over the grooves 40, form gas channels within which a backside cooling gas may be maintained to facilitate heat transfer from the wafer 38 to the pedestal 32.

Referring again to FIG. 1, during processing of the wafer 38 in the chamber, the vacuum pump evacuates the chamber to a pressure below the process pressure, and a metered flow of a process gas or gases are flowed through the inlet 20 and thus into the chamber 10. A mass flow controller (not shown) on the inlet 20, in conjunction with the pumping rate of gases from the chamber 10 by the pump, maintains the desired chamber pressure and gas concentration in the vacuum enclosure 18. A power supply 44 (shown schematically in FIG. 1) applies a voltage to the chamber 10 to excite the gases into a plasma. Where the chamber 10 is configured as an etch chamber as shown and described herein, the power supply 44 is preferably an r.f. power supply, and the voltage is applied to the conductive member 30 while the enclosure wall 12 is grounded. An etch plasma is thus created from the gases in the vacuum enclosure 18, to etch the exposed surface of the wafer 38.

The etch process environment gives off large quantities of heat, the total heat generated by the plasma being at least partially dependant on the power density of the plasma. A portion of this heat is transferred into the wafer 38, and it must be removed from the wafer 38 to maintain the temperature of the resist layer on the wafer 38 below a predefined critical temperature. Typically, the critical temperature is approximately 120° C., the temperature at which the resist rapidly deteriorates. To remove this heat, the prior art support member included the coolant channels 50 received through the mass of the conductive member 30 and a gas was flowed through the grooves 40 in the electrostatic chuck 34, to increase the heat transfer from the wafer 38 and into the pedestal 32.

Figure 4:
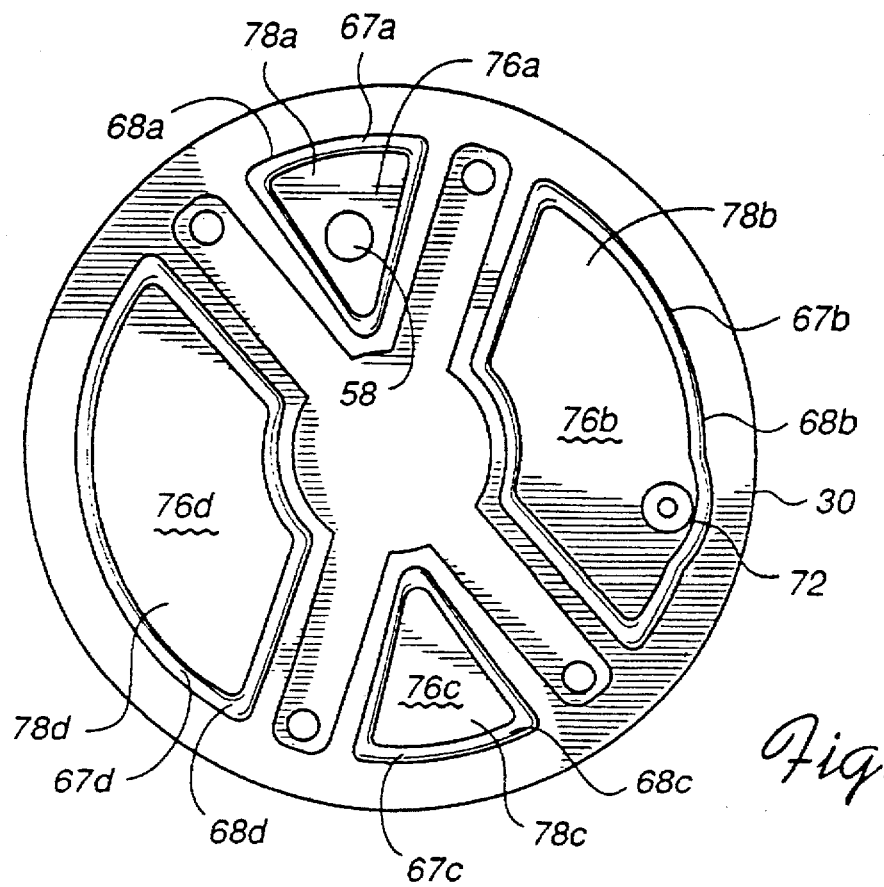
FIG. 4 is a sectional view of the wafer support member of the processing chamber of FIG. 1 at 4—4.
Figure 3:
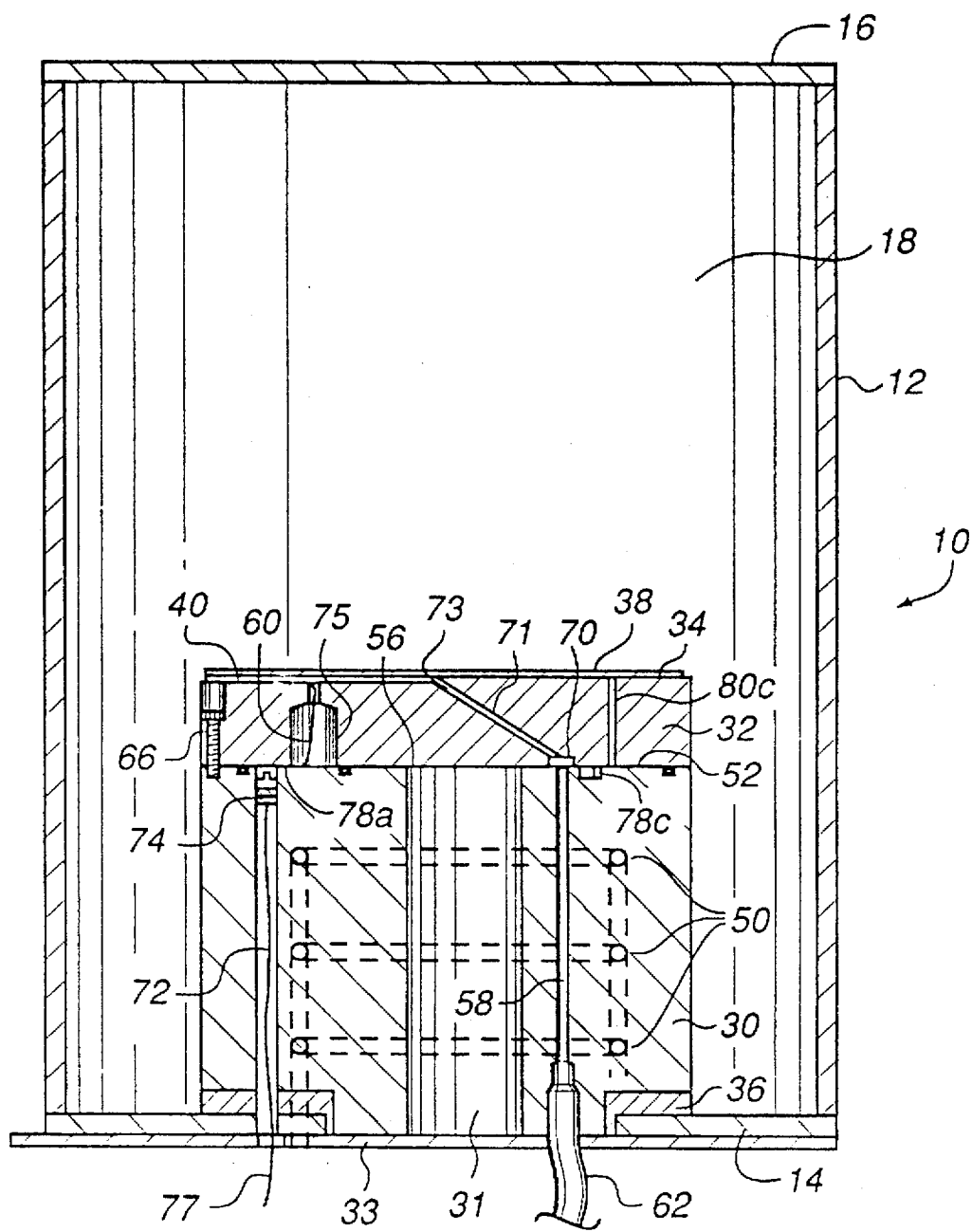
FIG. 3 is a sectional view of the wafer support member of the processing chamber of FIG. 1 at 3—3.

Referring now to FIGS. 3 and 4, the construction of the support member 26 to enable a gas flow to the electrostatic chuck 34, and to enable a power supply connection to the electrostatic chuck 34, is shown. The conductive member 30 is a generally cylindrical member, having a hollow cylindrical interior 56. A gas feed bore 58 and electrostatic chuck power supply bore 72 extend through the conductive member 30. Additionally, a coolant feed line (not shown), and a coolant return line (not shown), are connected to the underside of the conductive member 30 to provide a flow of coolant through the channels or passages 50 in the conductive member 30.

The pedestal 32 is received over the conductive member 30 and is connected thereto by a plurality of bolts 66 (one shown in FIG. 3) disposed about the perimeter of the pedestal 32 and the conductive member 30. The bolts 66 ensure intimate contact at the portion of the interface 52 between the pedestal 32 and the conductive member 30 adjacent the bolts. The conductive member 30 also includes a gas feed bore 70 extending into the underside thereof. A gas supply line 62 is connected to the gas feed 58 at the base of the conductive member 30, to supply a gas to the underside of the pedestal 32 at the pedestal 32-conductive member 30 interface 52. A small diameter through bore 71 extends from the interface 52, at the intersection of the upper end 70 of the gas feed 58 therewith, and through the pedestal 32 to an aperture 73 (shown in FIG. 2) in the center of the electrostatic chuck 34, to feed the gas from the gas feed 58 to the grooves 40 in the electrostatic chuck 34.

Referring to FIG. 3, to provide the electrical power to the electrostatic chuck 34, a conductive strap 60 extends from the electrostatic chuck 34 on the upper surface of the pedestal 32, through a strap bore 75 extending through the pedestal 32 and terminating on the underside of the pedestal 32. The conductive member 30 includes the power supply bore 72, which extends from the base 14 of the chamber 10 and through the conductive member 30 to the interface 52 between the conductive member 30 and the pedestal 32 and adjacent to the terminus of the strap 60 on the underside of the pedestal 32. The electrostatic chuck power supply strap 60 is connected to a pin connector 74 in the power supply bore 72, to provide the power connection to the electrostatic chuck 34. A power lead 77 extends through the power supply bore 72, to supply power to the pin connector 74, and thus to the electrostatic chuck 34. A seal, not shown, may be disposed at the upper end of the power supply bore 72 to seal the upper end of the power supply bore 72 to the underside of the pedestal 32, and thereby isolate the interface 52 between the pedestal 32 and the conductive member 30 from the atmospheric conditions present within the power supply bore 72.

Referring now to FIGS. 2, 3 and 4, the configuration of the support member 26 for providing enhanced heat transfer between the pedestal 32 and the conductive member 30 preferably includes the use of a gas supplied into the interface 52 between the pedestal 32 and the conductive member 30 to increase the heat transfer between these two chamber 10 components and thus provide a substantial increase in heat transfer from the wafer 38 and into the coolant flowed through the conductive member 30. The interface 52 comprises substantially enclosed regions that maintain and hold coolant gas in the enclosed regions, or allow coolant gas to flow through the interface 52 and into the chamber 10.

In the preferred embodiment of the invention, the gas supplied to the grooves 40 in the electrostatic chuck 34 is also supplied to the interface 52 between the conductive member 30 and the pedestal 32. To enable the use of this gas as a heat transfer enhancement between the pedestal 32 and the conductive member 30, the upper surface of the conductive member 30 includes a plurality of grooves 267 a–d therein as shown in FIG. 4, each of which grooves 67 a–d circumscribes a region 76 a–d on the upper surface of the conductive member 30. When the pedestal 32 is attached to the conductive member 30, and o-ring or other seals 68 a–d are placed in the grooves 67 a, the regions 76 a–d define enclosed regions, or sealed chambers 78 a–d, within the interface 52 between the conductive member 30 and the pedestal 32. When a gas is ported to these sealed chambers 78 a–d, the gas enables increased heat transfer between the pedestal 32 and the conductive member 30, thereby enabling increased heat transfer from the wafer 38, through the pedestal 32 and thus into the cooling water flowing through the conductive member 30. Additionally, the heat transfer paths through the sealed chambers 78 a–d cooperate with existing heat transfer paths at the interface 52, such as that at the bolt circle, to provide more uniform heat transfer through the interface 52 and thus a provide a more uniform temperature at the wafer 38 surface.

To provide a gas flow to the sealed chambers 78 a–d, the backside cooling gas must be routed to the interface 52. To provide this routing, the pedestal 32 includes a plurality of apertures 80 a–d therethrough, wherein each of the apertures 80 a–d communicates between one of the chambers 78 a–d in the interface 52 and one of the grooves 40 in the electrostatic chuck 34. Preferably, one of the apertures 80a also serves as a feed aperture through which the electrostatic chuck power supply strap 60 extends. The gas supplied by the gas feed 58 passes through the pedestal 32 and into the grooves 40 in the electrostatic chuck 34. In the prior art, a seal was maintained between the pedestal 32 and the conductive member 30 at the upper end of the gas feed bore to ensure that the backside cooling gas did not leak into the interface 52. This seal may be omitted to allow the backside gas supplied by the gas feed 58 to directly pass into the region 78d which surrounds the opening of the gas feed 58 into the interface 52. However, the invention specifically contemplates that the gas may be supplied to the chambers 78 a–d entirely through the apertures 80 a–d. As the backside gas flows into the grooves 40, the gas also flows through the apertures 80 a–d and into the chambers 78 a–d to increase the heat transfer between the pedestal 32 and the conductive member 30. The gas will flow freely into the sealed chambers 78 a–d, because the sealed chambers 78 a–d are ported to the chamber 10 vacuum enclosure through the apertures 80 a–d, and therefore will be evacuated by the chamber pump to a low vacuum pressure between wafer processing cycles. Because the chamber 10 is typically pumped down to a pressure lower than the etch processing pressure between wafer etch processes, the sealed chambers 78 a–d may be voided off, and refilled with, the gas during each wafer process cycle. However, the presence of residual amount of the cooling gas in the interface 52 will have no consequence on the performance of the chamber or the enhanced heat transfer rate from the pedestal 32 to the conductive member 30. Therefore, the sealed chambers 78 a–d need not be evacuated during each process cycle.

To ensure the greatest heat transfer between the pedestal 32 and the conductive member 30, the gap between the pedestal 32 and the conductive member 30 should be as small as possible. The thermal conductivity of a gas is dependant, in part, on the size of the gap across which the gas supplies the means of heat transfer. The thermal conductivity of the gas generally increases as the gap size is decreased. Additionally, it is contemplated that some physical contact will occur between the pedestal 32 and the conductive member 30. Therefore, it is preferable that the seals 68 a–d only provide a barrier to maintain the gas within the sealed chambers 78 a–d, but not increase the spacing between the conductive member 30 and the pedestal 32.

The enhanced heat transfer between the pedestal 32 and the conductive member 30 enabled by the gas regions 78 a–d occurs substantially free of defect creating particles, in contrast to the particle generating prior art films and foils. Additionally, the heat transfer rate between the conductive member 30 and the pedestal 32 may be modified by changing the pressure of the gas in the interface 52 and/or the size of the gap between the conductive member 30 and the pedestal 32 to vary the heat transfer between the conductive member 30 and the pedestal 32. Additionally, although the preferred means for providing the gas to the sealed chambers 78 a–c is through the upper surface of the pedestal 32, other gas supply configurations, such as directly flowing a gas supply through pedestal 32 and thus into all four of the sealed chambers 78 a–d, flowing the gas through the sealed chambers 78 a–d by providing gas inlets and outlets to each of the sealed chambers 78 a–d, or providing other configurations of the interface 52 region such as a single sealed chamber in the interface 52, are specifically contemplated.

By maintaining a gas in the sealed chambers 78 a–d, the wafer 38 temperature, as compared the wafer 38 temperature using an identical chamber 10 configuration and plasma power density, is decreased, and the uniformity of the temperature across the wafer may be enhanced. For example, where a 200 mm diameter wafer 38 is etched in an 1000 watt plasma at steady state chamber 10 operating conditions, i.e., where several wafers have been previously processed and the etch chamber 10, and where the conductive member 30 is maintained at 16° C. and the backside gas pressure is maintained at 8 torr, the maintenance of the gas in the sealed chambers 78 a–d between the pedestal 32 and the conductive member 30 resulted in a wafer temperature decrease of approximately 5° C. where the wafer is processed in the plasma for 120 seconds. If the gas pressure is increased, the heat transfer rate through the gas will increase, and this increased heat transfer will result in an even lower wafer temperature. Although the invention specifically contemplates that heat transfer in the sealed chambers will occur through the gas by both convection and conduction, conductive heat transfer is preferred.

The heat transfer through the gas, and thus the better wafer cooling enabled by the present invention, provides several benefits to the wafer fabricator. First, for a given power density, the wafer may be maintained at cooler temperatures. Additionally, the power densities in the etch plasma may be increased by an amount that raises the wafer temperature to the non-gas cooled level, to enable faster plasma etch rates without exceeding the maximum resist temperature. Finally, a slightly greater power density, with a slightly lower processing temperature, may be used to provide the desired etch rate.

Although the invention has been described in terms of using a gas, preferably the backside cooling gas such as argon or helium, to enable a higher heat transfer rate between the conductive member and the pedestal, the invention specifically contemplates the use of other fluids, such as liquids or liquid gas mixtures, to enable the enhanced heat transfer of the present invention.

I claim:

1. A support for supporting a substrate in a processing environment, comprising:
   (a) a support member;
   (b) a pedestal on the support member, the pedestal and support member forming an interface therebetween, the interface comprising at least one substantially enclosed region therein;
   (c) a chuck on the pedestal for supporting the substrate, the chuck having at least one gas groove therein;
   (d) a gas feed for supplying cooling gas to the gas groove to enable heat transfer between the substrate and the chuck; and
   (e) at least one gas supply aperture extending from the gas groove of the chuck and terminating at the substantially enclosed region of the interface to enable cooling gas to flow from the gas groove to the interface, thereby enabling the cooling gas to transfer heat between the pedestal and the support member.

2. The support of claim 1, wherein the interface comprises multiple substantially enclosed regions, and wherein multiple gas supply apertures extend into each of the substantially enclosed regions.

3. The support of claim 2, wherein surface-to-surface contact present between the support member and the pedestal forms the substantially enclosed regions.

4. The support of claim 1, wherein the gas feed comprises:
   (a) a first cooling gas supply passage extending through the support member;
   (b) a second cooling gas supply passage extending through the pedestal and terminating at an upper surface of the pedestal, wherein the first and second cooling gas supply passages are aligned at said at least one substantially enclosed region in the interface ; and
   (c) a gap at the alignment of the first and second cooling gas supply passages sized sufficient to enable cooling gas flowing into the first cooling gas passage to flow into said at least one substantially enclosed region.

5. A method for cooling a semiconductor wafer in a processing environment comprising the steps of:
   (a) placing a wafer on the chuck of the support of claim 1; and
   (b) providing cooling gas from the gas feed to the gas groove on the chuck, and from the gas groove through the gas supply aperture into the interface.

6. The support of claim 1, wherein the at least one substantially enclosed region of the interface comprises at least one sealed chamber.

7. The support of claim 1, wherein the at least one substantially enclosed region of the interface comprises non-contact regions and contact regions, the non-contact regions allowing the cooling gas to flow through the interface and into the chamber.

8. A support for supporting substrates in a processing environment, comprising:
   (a) a support member;
   (b) a pedestal on the support member forming an interface therebetween, the interface including a plurality of substantially enclosed regions;
   (c) a chuck on the pedestal for supporting substrates, the chuck having a plurality of gas grooves therein;
   (d) a gas feed for supplying cooling gas to the gas grooves for enabling heat transfer between the substrate and the chuck; and
   (e) a plurality of gas supply apertures, each aperture extending from a groove in the chuck to one of the substantially enclosed regions in the interface for supplying the cooling gas to the enclosed regions, thereby enabling heat transfer between the pedestal and the support member through the cooling gas.

9. The support of claim 8, wherein the gas feed comprises:
   (a) a first cooling gas supply passage extending through the support member;
   (b) a second cooling gas supply passage extending through the pedestal and terminating at an upper surface of the pedestal, wherein the first and second cooling gas supply passages are aligned at one of the substantially enclosed regions in the interface ; and
   (c) a gap at the alignment of the first and second cooling gas supply passages sized sufficient to enable cooling gas flowing into the first cooling gas passage to flow into at least one of the substantially enclosed regions.

10. The support of claim 8, wherein the substantially enclosed regions at the interface comprises sealed chambers.

11. The support of claim 8, wherein the substantially enclosed regions at the interface allow cooling gas to flow therethrough and into the chamber.

* * * * *